United States Patent [19]

Takeda et al.

[11] Patent Number: 4,997,748
[45] Date of Patent: Mar. 5, 1991

[54] DEVELOPER SOLUTION FOR POSITIVE-WORKING RESIST COMPOSITION

[75] Inventors: Yasuyuki Takeda, Atsugi; Hatsuyuki Tanaka, Samukawa; Toshimasa Nakayama, Hiratsuka, all of Japan

[73] Assignee: Tokyo Ohka Kogyo Co., Ltd., Kanagawa, Japan

[21] Appl. No.: 394,586

[22] Filed: Aug. 16, 1989

[30] Foreign Application Priority Data

Aug. 26, 1988 [JP] Japan ................. 63-210666
Jun. 7, 1989 [JP] Japan ................. 1-143126

[51] Int. Cl.$^5$ ............. G03C 5/00; G03C 1/52
[52] U.S. Cl. ................. 430/331; 430/192; 430/193; 430/326
[58] Field of Search ............. 430/331, 149, 329

[56] References Cited

U.S. PATENT DOCUMENTS 4,729,941 3/1988 Itoh et al. .
4,744,834 5/1988 Haq ..................... 430/331
4,820,621 4/1989 Tanka et al. .......... 430/331

FOREIGN PATENT DOCUMENTS 0124297 11/1984 European Pat. Off. .
0177905 4/1986 European Pat. Off. .
0186184 7/1986 European Pat. Off. .
0286272 12/1988 European Pat. Off. .

OTHER PUBLICATIONS

Chemical Abstracts: Cho, Developers for positive-working photoresists, 105819n, 1989.
Chemical Abstracts, 46231y, (vol. III), 1988.
Chemical Abstracts, 14284p, (vol. 112), 1990.

*Primary Examiner*—Paul R. Michl
*Assistant Examiner*—John S. Y. Chu
*Attorney, Agent, or Firm*—Wyatt, Gerber, Burke and Badie

[57] ABSTRACT

The developer solution of the invention is suitable for use to develop a positive-working resist composition comprising an alkali-soluble novolac resin and a naphthoquinone diazide compound and capable of giving a patterned image of the resist layer with a high contrast and increasing the effective depth of focus. The characteristic ingredient in the inventive developer solution is an alkali-soluble organic cyclic nitrogen compound such as N-hydroxyethyl piperazine, N-methyl-4-piperidone, 1,3-dimethyl-2-imidazolidinone and the like added in a specified concentration to a conventional developer solution containing tetramethyl ammonium hydroxide or choline as the water-soluble alkaline compound.

4 Claims, 2 Drawing Sheets

DEVELOPER SOLUTION FOR POSITIVE-WORKING RESIST COMPOSITION

BACKGROUND OF THE INVENTION

The present invention relates to a developer solution for a positive-working resist composition. More particularly, the invention relates to a developer solution for a positive-working resist composition of the type comprising an alkali-soluble novolac resin as the film-forming resinous component and a naphthoquinone diazide compound as the sensitive component and capable of forming a resist pattern by irradiation with actinic rays. In particular, the invention has an object to provide a developer solution capable of greatly improving the contrast and depth of focus of patterned images formed from a positive-working resist composition.

As is well known, manufacturing processes of various kinds of electronic devices and components such as semiconductor-based integrated circuits, photomasks for the manufacture of integrated circuits, printed circuit boards and the like always involve a step of an area-selective surface treatment of the substrate such as etching treatment, diffusion treatment and the like. It is usual in such a selective surface treatment that a patternwise layer of a resinous resist composition having sensitivity to actinic rays such as ultraviolet light, X-rays, electron beams and the like is formed on the substrate surface with an object to protect the areas of the substrate surface which should not be subjected to the surface treatment.

Such a patternwise protecting resist layer is formed on the substrate surface by a method including the steps of forming a coating layer of a resist composition on the substrate surface, irradiating the resist layer patternwise with actinic rays and developing the latent images formed by the irradiation with a developer solution. Resist compositions are classified depending on the types of sensitivity to the actinic rays into positive-working ones, of which the areas of the resist layer irradiated with actinic rays are imparted with increased solubility in developer solutions while the unirradiated areas are left insoluble, and negative-working ones, of which the solubility behavior of the irradiated and unirradiated areas in developer solutions is reverse to that in the positive-working resist compositions.

Along with the trend in recent years toward higher and higher dimensional fineness of working in the manufacture of electronic parts in general, prevalence in use is directed to the positive-working resist compositions over negative-working ones owing to the advantage of the high resolving power of the former as compared with the latter. Positive-working resist compositions of a typical type are formulated with an alkali-soluble novolac resin as the resinous film-forming ingredient and a naphthoquinone diazide compound as the ingredient having sensitivity to actinic rays. The resist layer formed from such a positive-working resist composition formulated with a novolac resin and a naphthoquinone diazide compound can be developed with an aqueous alkaline solution as the developer solution, in which the water-soluble alkaline compound is usually an organic alkaline compound such as tetramethyl ammonium hydroxide, choline, i.e. trimethyl 2-hydroxyethyl ammonium hydroxide, and the like. Though useful in most cases as a developer solution for positive-working resist compositions, one of the problems in the developer solutions of this type is that the difference in the solubility behavior is relatively small between the areas unirradiated and irradiated with actinic rays or the contrast in the image formation so that the cross sectional profile of a line pattern of the developed resist layer sometimes has trailing skirts on the substrate surface to greatly decrease the accuracy or fidelity of the resist pattern. This problem is particularly serious when the solution is used for the development of a resist pattern having increased fineness reaching the so-called submicron order. Accordingly, the performance of the developer solution available is a limiting factor which prohibits compliance with the demand for an increased dimensional fineness of working in the manufacture of modern semiconductor integrated circuits.

On the other hand, improvements in the technology of irradiation with actinic rays also have a great influence to facilitate an increase in the working fineness in the manufacture of semiconductor devices. For example, patterned resist layers having a submicron order fineness can easily be obtained by the techniques of minifying projection exposure recently developed utilizing a lamp emitting the i-line ultraviolet light having a short wavelength of 365 nm as the light source. Nonetheless, this method cannot be without any problems in the practical application in respect of the problem relative to the depth of focus.

This problem in the depth of focus or the problem that the depth of focus is decreased when the resolving power is increased is unavoidable in so far as the irradiation apparatus for the patternwise irradiation utilizes an optical system. However, the disadvantage due to a decreased depth of focus can be compensated for by using a developer solution capable of giving a high-contrast image by which an effective resist pattern can be obtained even with a small depth of focus and samll width of light-intensity distribution.

In this regard, various proposals have been made for the formulation of a developer solution for positive-working resist compositions with an object to increase the contrast of the developed images including an aqueous solution of a cyclic amine compound as a developer solution for a 1,2-naphthoquinone diazide-based positive-working resist composition disclosed in Japanese Patent Kokai No. 57-30832, an aqueous soluion of a cyclic quaternary ammonium hydroxide compound disclosed in Japanese Patent Kokai No. 60-179738 and the like. The developer solutions of the former type are defective because, although they are useful for the development of a positive-working resist composition of which the resinous ingredient is a copolymer of an α,β-unsaturated olefinic carboxylic acid, they are not applicable to the positive-working resist compositions comprising a novolac resin as the film-forming ingredient used in the major current of the modern technology. The developer solution of the latter type is also disadvantageous and not practicable because the cyclic quaternary ammonium hydroxide compound as the principal ingredient of the aqueous solution must be prepared in a very complicate process including a step of N-methylolation of a cyclic nitrogen compound followed by ion exchange so that stability in the developing performance of the developer solution can hardly be expected as a consequence of the complicate preparation procedure of the solution not to give reproducible results in the patterning of resist layers.

SUMMARY OF THE INVENTION

The present invention accordingly has an object to provide a developer solution for positive-working resist compositions formulated with an alkali-soluble novolac resin as the film-forming ingredient and a naphthoquinone diazide compound as the ingredient having sensitivity to actinic rays capable of giving a developed image of high contrast to compensate for a decrease in the depth of focus by overcoming the problems and disadvantages in the prior art developer solutions for positive-working resist compositions.

Thus, the developer solution of the present invention for developing a positive-working resist composition comprising an alkali-soluble novolac resin and a naphthoquinone diazide compound is an aqueous solution comprising:
(a) water as the solvent;
(b) a water-soluble organic alkaline compound; and
(c) an alkali-soluble organic cyclic nitrogen compound.

In particular, the water-soluble organic alkaline compound as the component (b) is tetramethyl ammonium hydroxide or choline. The alkali-soluble organic cyclic compound as the component (c) is preferably selected from the group consisting of N-hydroxyethyl piperazine, N-methyl-4-piperidone and 1,3-dimethyl-2-imidazolidinone. The amount of the alkali-soluble organic cyclic compound contained in the developer solution is in the range from 0.1 to 10% by weight or, preferably, from 0.3 to 5.0% by weight of the solution.

DETAILED DESCRIPTION OF THE PREFERRED EMBODIMENTS

Figure 1A:
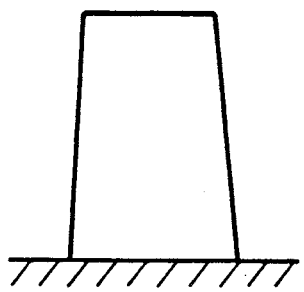
FIGS. 1a and 1b each schematically illustrate a cross sectional profile of a line pattern of a resist layer on a substrate surface.

As is understood from the above given description, the developer solution of the present invention is characterized by the addition of a specific alkali-soluble organic cyclic nitrogen compound to an aqueous solution of a water-soluble organic alkaline compound. The water-soluble organic alkaline compound is not particularly limitative but is preferably tetramethyl ammonium hydroxide or choline. These compounds can be used in combination, if desired. The concentration of the water-soluble organic alkaline compound in the developer solution is usually in the range from 1.0 to 10.0% by weight or, preferably, in the range from 1.5 to 7.0% by weight. When the concentration thereof is too low, the effective sensitivity of patterning is decreased. When the concentration thereof is too high, on the other hand, the resist composition is subject to the attack of the developer solution even in the areas unirradiated with actinic rays so that the patterned resist layer obtained by development has an undesirably decreased thickness.

The alkali-soluble organic cyclic nitrogen compound as the most characteristic ingredient in the inventive developer solution is exemplified by pyrrole, pyrrolidine, pyrrolidone, indole, pyridine, pyridone, piperidone, piperidine, quinoline, pyrazole, imidazole, imidazolidine, imidazolidinone, pyridazine, pyrimidine, pyrazine, piperazine, triazole, oxazole, morpholine and thiazole as well as derivatives thereof. Preferable examples of the compound include 2-hydroxyethyl pyridine, N-methyl piperazine, N-hydroxyethyl piperazine, 2-hydroxyethyl piperazine, 2-methyl imidazole, 4-(2-hydroxyethyl)morpholine, 1-(2-hydroxyethyl)pyrrolidone, N-methyl-4-piperidone, 2-amino thiazole, 1,3-dimethyl-2-imidazolidinone and the like, of which N-hydroxyethyl piperazine, N-methyl-4-piperidone and 1,3-dimethyl-2-imidazolidinone are the most preferred in respect of the improvement in the contrast and depth of focus in the developed images as well as absence of scums on the substrate surface after development. These cyclic nitrogen compounds can be used either singly or as a combination of two kinds or more according to need.

The concentration of the alkali-soluble organic cyclic nitrogen compound described above in the inventive developer solution is usually in the range from 0.1 to 10% by weight or, preferably, from 0.3 to 5.0% by weight. When the concentration thereof is too low, the object of the invention cannot be achieved as a matter of course. When the concentration thereof is too high, on the other hand, the resist layer in the unirradiated areas may be subject to the attack of the developer solution to some extent so that the contrast of the patterned image is undesirably decreased.

The positive-working resist composition to which the inventive developer solution is applied comprises an alkali-soluble novolac resin and a naphthoquinone diazide compound as the basic ingredients. Suitable alkali-soluble novolac resins include those obtained from a phenolic compound such as phenol, cresol, xylenol and the like and an aldehyde such as formaldehyde. Cresol novolac resins are preferable as the alkali-soluble novolac resin. More preferably, the cresol novolac resin should be prepared from an isomeric mixture of 10 to 45% by weight of m-cresol and 90 to 55% by weight of p-cresol with substantial absence of o-cresol. Use of such a cresol novolac resin facilitates obtaining a resist pattern having excellent dimensional accuracy and stability.

The naphthoquinone diazide compound to be combined with the novolac resin includes those by the complete or partial esterification or complete or partial amidation of an o-naphthoquinone diazide sulfonic acid with a compound having a phenolic hydroxy group or an amino group. The esterification agent having a phenolic hydroxy group is exemplified by polyhydroxy benzophenones such as 2,3,4-trihydroxy benzophenone, 2,2',4,4'-tetrahydroxy benzophenone, 2,3,4,4'-tetrahydroxy benzophenone and the like, alkyl gallates, aryl gallates, phenol, p-methoxy phenol, dimethyl phenols, hydroquinone, bisphenol A, naphthols, pyrocatechol, pyrogallol, pyrogallol monomethyl ether, pyrogallol 1,3-dimethyl ether, gallic acid, esters or ethers of gallic acid having at least one hydroxy group unesterified or unetherified and so on. The amidation agent above mentioned is exemplified by aniline, 4-amino diphenyl amine and so on.

The amount of the above described naphthoquinone diazide compound is usually in the range from 10 to 40% by weight based on the amount of the alkali-soluble novolac resin in the positive-working resist composition. When the amount thereof is too small, the resist composition is practically not useful because of the poor cross sectional profile of the line pattern of the resist layer obtained therefrom. When the amount thereof is too large, on the other hand, the resist composition may have a greatly decreased sensitivity to actinic rays.

The developer solution of the invention is applicable to the development treatment of any positive-working resist compositions provided that the principal ingredients therein are an alkali-soluble novolac resin and a naphthoquinone diazide compound including those having sensitivity to various kinds of actinic rays such as ultraviolet light, far-ultraviolet light, electron beams, X-rays and the like. For example, preferable positive-working electron beam-sensitive resist compositions include those formulated with a cresol novolac resin prepared from an isomeric cresol mixture of 10 to 45% by weight of m-cresol and 90 to 55% by weight of p-cresol and at least one kind of naphthoquinone-1,2-diazide-4-sulfonic acid esters with a polyhydroxy benzophenone compound selected from 2,3,4-trihydroxy benzophenone, 2,2',4,4'-tetrahydroxy benzophenone and 2,3,4,4'-tetrahydroxy benzophenone. Quite satisfactory results can be obtained in respect of the greatly enhanced contrast of the patterned images when the above mentioned ester compound of which the degree of esterification is 60% or higher is used as the sensitizing component in the positive-working electron beam-sensitive resist composition to be developed with the inventive developer solution.

The positive-working resist composition is prepared by dissolving the alkali-soluble novolac resin and the naphthoquinone diazide compound each in a specified amount in a suitable organic solvent. Examples of the organic solvent used in the positive-working resist composition include ketone compounds such as acetone, methyl ethyl ketone, cyclohexanone, isoamyl ketone and the like, polyhydric alcohols and derivatives thereof such as ethylene glycol, propylene glycol, ethylene glycol monoacetate, monomethyl, monoethyl, monopropyl, monoisopropyl, monobutyl and monophenyl ethers of diethylene glycol or diethylene glycol monoacetate and the like, cyclic ether compounds such as dioxane and the like, and ester compounds such as methyl acetate, ethyl acetate, butyl acetate and the like. These organic solvents can be used either singly or as a mixture of two kinds or more according to need.

As is described above, the developer solution of the invention comprises, in addition to a water-soluble organic alkaline compound, an alkali-soluble organic cyclic nitrogen compound as the characteristic ingredient, by virtue of which the inventive developer solution, when used in the development treatment of a positive-working resist composition comprising an alkali-soluble novolac resin and a naphthoquinone diazide compound, gives a patterned resist layer having an excellently orthogonal cross sectional profile of the line pattern with a greatly enhanced contrast of the images thereby to increase the effective depth of focus as a consequence. In addition, the inventive developer solution acts also as a scum remover so that quite satisfactory results can be obtained even in an extremely fine patterning work of positive-working resist layers.

In the following, examples are given to illustrate the developer solution of the invention in more detail but not to limit the scope of the invention in any way.

EXAMPLES 1 TO 7 AND COMPARATIVE EXAMPLE 1

Eight developer solution, referred to as the solutions I to VIII hereinbelow, were prepared each by admixing an aqueous solution of tetramethyl ammonium hydroxide in an amount to give a concentration in the developer solution indicated in the table below without (solution VIII) or with (solutions I to VII) addition of an alkali-soluble organic cyclic nitrogen compound of the kind and in an amount to give a concentration in the developer solution indicated in the same table.

Separately, a positive-working resist composition was prepared by dissolving, in 390 parts by weight of ethylene glycol monoethyl ether acetate, 100 parts by weight of a cresol novolac resin obtained by the condensation reaction of a 40:60 by weight mixture of m-cresol and p-cresol and formalin with oxalic acid as the catalyst in a conventional procedure and 30 parts by weight of a 2,3,4-trihydroxy benzophenone ester of naphthoquinone-1,2-diazide-5-sulfonic acid followed by filtration of the solution through a membrane filter having a pore diameter of 0.2 μm.

A 4-inch silicon wafer after a surface treatment with hexamethyl disilazane was coated with the thus prepared resist solution on a spinner in a coating thickness of 1.35 μm as dried and pre-baked on a hot plate at 110° C. for 90 seconds. The resist-coated silicon wafer was then exposed patternwise to ultraviolet light through a test chart reticle on a minifying projection exposure apparatus (Model NSR-1505G4D, manufactured by Nikon Co.) and subjected to a development treatment by using one of the above prepared developer solutions I to VIII at 23° C. for 65 seconds followed by rinsing with water for 30 seconds and drying.

The table below summarizes the results obtained in this test including the effective sensitivity of the resist composition expressed by the exposure time in milliseconds required for complete removal of the resist layer by the developer solution in the areas exposed to the ultraviolet light, the cross sectional profile of the line pattern of the developed resist layer noted with the symbols of a and b corresponding to an orthogonal cross section illustrated by FIG. 1a and a cross section with rounded shoulders and trailing skirts illustrated by FIG. 1b, respectively, and the condition of scums on the surface after development noted by the symbols of A, B and C corresponding to absolute absence of scums, detectable, though not easily, amount of scums and noticeable amount of scums on the areas exposed to the ultraviolet light, respectively.

TABLE

| Developer solution | Concentration of aqueous solution of tetramethyl ammonium hydroxide, % by weight | Cyclic nitrogen compound | | Sensitivity, milliseconds | Cross sectional profile | Scums |
| --- | --- | --- | --- | --- | --- | --- |
| | | Kind | % by weight | | | |
| I | 2.14 | Pyridine | 0.5 | 200 | a | B |
| II | 2.10 | 2-Hydroxyethyl piperidine | 2.0 | 180 | a | B |
| III | 2.10 | N-Methyl piperazine | 2.5 | 180 | a | B |
| IV | 1.88 | 2-Methyl imidazole | 2.0 | 200 | a | B |
| V | 2.10 | 4-(2-Hydroxyethyl)-morpholine | 1.5 | 220 | a | B |

TABLE -continued

| Developer solution | Concentration of aqueous solution of tetramethyl ammonium hydroxide, % by weight | Cyclic nitrogen compound Kind | % by weight | Sensitivity, milliseconds | Cross sectional profile | Scums |
|---|---|---|---|---|---|---|
| VI | 2.10 | 1-(2-Hydroxyethyl)-2-pyrrolidone | 1.5 | 190 | a | B |
| VII | 2.10 | N-Methyl-4-piperidone | 1.5 | 230 | a | A |
| VIII | 2.38 | — | — | 180 | b | C |

EXAMPLE 8

The same experimental procedure as in Example 1 was repeated except that the positive-working resist composition was a commercial product (TSMR-8800, a product by Tokyo Ohka Kogyo Co.) containing a cresol novolac resin and a naphthoquinone diazide compound and the developer solution was a 4.60% by weight aqueous solution of choline with addition of 2.5% by weight of N-hydroxyethyl piperazine. The results were that the sensitivity was 160 ms and the cross sectional profile of the line pattern was exactly orthogonal as is illustrated in FIG. 1a. Further, absolutely no scums were found on the substrate surface after the development treatment.

For comparison, the same experimental procedure as above was repeated excepting omission of the N-hydroxyethyl piperazine in the developer solution. The results were that the sensitivity was 150 ms but the cross sectional profile of the line pattern was not orthogonal with rounded shoulders and trailing skirts as is illustrated in FIG. 1b. Scums were found on the substrate surface after the development treatment.

EXAMPLE 9

Figure 2:
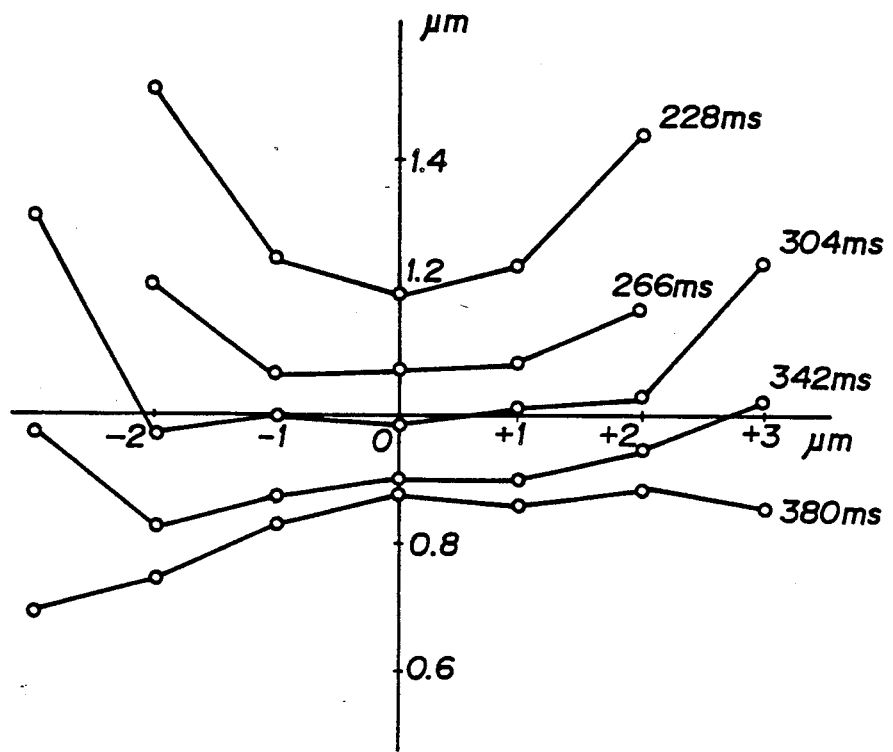
FIGS. 2 and 3 are each a graph showing the depth of focus as a function of the dimension of the resist pattern obtained by using a conventional developer solution and the inventive developer solution, respectively, with the exposure time as a parameter.
Figure 3:
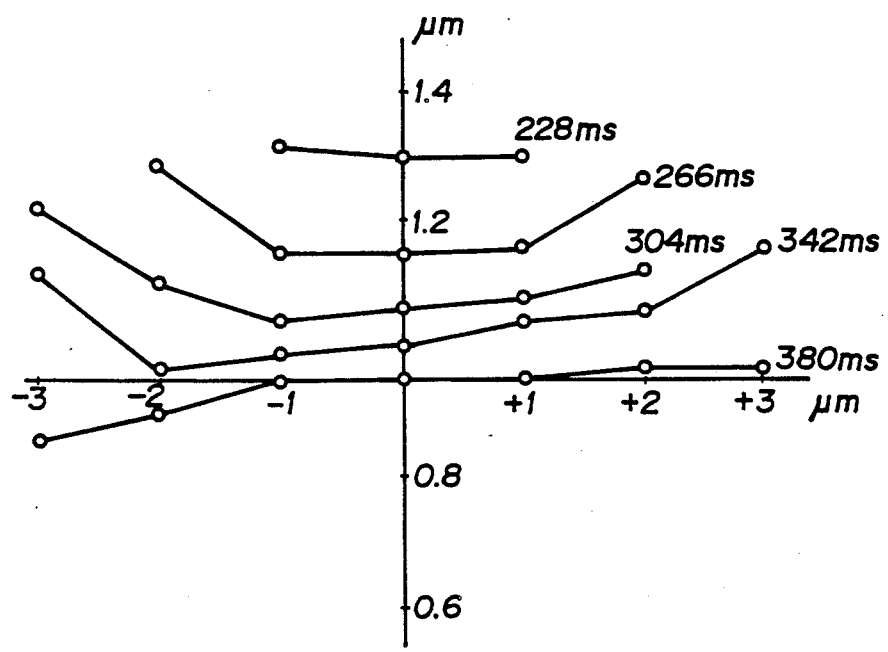

The same experimental procedure as in Example 1 was repeated for patterning of the same positive-working resist composition except that the developer solution was a 2.38% by weight aqueous solution of tetramethyl ammonium hydroxide or a 2.14% by weight aqueous solution of tetramethyl ammonium hydroxide with addition of 2.5% by weight of N-hydroxyethyl piperazine. The thus obtained resist patterns were subjected to the determination of the depth of focus for the line patterns of 1.0 μm width to give the results graphically shown in FIG. 2 and FIG. 3, respectively, taking the distance in μm from the center line of the line pattern as the abscissa and the width of the line pattern in μm as the ordinate. As is clearly understood from FIG. 3, addition of N-hydroxyethyl piperazine to the developer solution according to the invention has an effect of increasing the focus margin.

EXAMPLE 10

The experimental procedure for patterning of the resist layer was the same as in Example 8 using the commercial product of the positive-working resist composition except that the developer solution was a 2.10% by weight aqueous solution of tetramethyl ammonium hydroxide with addition of 1.5% by weight of 1,3-dimethyl-2-imidazolidinone. The results were that the sensitivity was 140 ms and the cross sectional profile of the line pattern was exactly orthogonal as is illustrated in FIG. 1a. Absolutely no scums were found on the substrate surface after the development treatment.

EXAMPLE 11

A positive-working electron beam-sensitive resist composition was prepared by dissolving, in 350 parts by weight of ethylene glycol monoethyl ether acetate, 100 parts by weight of the same cresol novolac resin as used in Example 1 and 17 parts by weight of an ester of 2,3,4-trihydroxy benzophenone with naphthoquinone-1,2-diazide-4-sulfonic acid with an average degree of esterification of 75% followed by filtration of the solution through a membrane filter having a pore diameter of 0.2 μm. A 4-inch silicon wafer after a surface treatment with hexamethyl disilazane was coated on a spinner with the thus prepared resist solution in a coating thickness of 0.5 μm as dried followed by prebaking on a hot plate at 80° C. for 90 seconds to form a resist layer which was irradiated patternwise with electron beams at an accelerating voltage of 20 kV using an electron-beam irradiation apparatus (Model HHS-2R, manufactured by Hitachi Ltd.). The resist layer was then developed by using a developer solution which was a 1.8% by weight aqueous solution of tetramethyl ammonium hydroxide with addition of 1.0% by weight of 2-hydroxyethyl pyridine and 2.0% by weight of 1,3-dimethyl-2-imidazolidinone at 23° C. for 90 seconds to dissolve away the resist layer in the areas irradiated with the electron beams and to form a patterned resist layer.

Figure 1B:
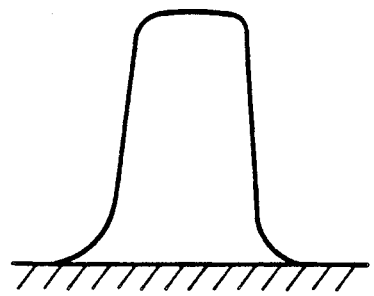

The thus obtained patterned resist layer had a very high contrast of the image and the cross sectional profile of the line pattern having a width of 0.5 μm was satisfactorily orthogonal on the substrate surface as is illustrated in FIG. 1a. The sensitivity at 90% residual film ratio was 18 μC/cm². Absolutely no scums were found on the areas irradiated with the electron beams after the development treatment.

EXAMPLE 12

The same experimental procedure as in Example 11 for obtaining a patterned resist layer on a silicon wafer was performed excepting that the sensitizing component in the positive-working resist composition was an ester of 2,2'4,4'-tetrahydroxy benzophenone and naphthoquinone-1,2-diazide-4-sulfonic acid with an average degree of esterification of 75% instead of the ester of 2,3,4-trihydroxy benzophenone and naphthoquinone-1,2-diazide-4-sulfonic acid and the time for the development was 120 seconds instead of 90 seconds. The results were substantially the same as in Example 11.

COMPARATIVE EXAMPLE 2

The same experimental procedure as in Example 11 was performed except that the developer solution was a 2.38% by weight aqueous solution of tetramethyl ammonium hydroxide without addition of the cyclic nitrogen compounds. The results were that the orthogonality of the cross sectional profile of the line pattern was poor with rounded shoulders and trailing skirts as is illustrated in FIG. 1b and the sensitivity at 90% residual film ratio was 40 μC/cm². In addition, scums were found on the areas of the substrate surface irradiated with the electron beams after the development treatment.

COMPARATIVE EXAMPLE 3

The same experimental procedure as in Example 12 was performed except that the developer solution was a 2.38% by weight aqueous solution of tetramethyl ammonium hydroxide without addition of the cyclic nitrogen compounds. The results were that the orthogonality of the cross sectional profile of the line pattern was poor with rounded shoulders and trailing skirts as is illustrated in FIG. 1b and the sensitivity at 90% residual film ratio was 80 μC/cm². In addition, scums were found on the areas of the substrate surface irradiated with the electron beams after the development treatment.

What is claimed is:

1. A developer solution for developing a positive-working resist composition comprising an alkali-soluble novolac resin and a naphthoquinone diazide compound, which solution comprises:
   (a) water as the solvent;
   (b) a water-soluble organic alkaline compound dissolved in the solvent in a concentration in the range from 1.0 to 10.0% by weight; and
   (c) an alkali-soluble organic cyclic nitrogen compound dissolved in the solvent in a concentration in the range from 0.1 to 10% by weight, wherein said compound is selected from the group consisting essentially of 2-hydroxyethyl pyridine, N-methyl piperazine, N-hydroxyethyl piperazine, 2-hydroxyethyl piperazine, N-hydroxyethyl piperazine, 2-methyl imidazole, 4-(2-hydroxyethyl) morpholine, 1-(2-hydroxyethyl) pyrrolidone, N-methyl-4-piperidone and 2-amino thiazole, 1,3-dimethyl-2-imidazolidinone.

2. The developer solution as claimed in claim 1 wherein the water-soluble organic alkaline compound as the component (b) is tetramethyl ammonium hydroxide or choline.

3. The developer solution as claimed in claim 1 wherein the alkali-soluble organic cyclic nitrogen compound as the component (c) is selected from the group consisting of N-hydroxyethyl piperazine, N-methyl-4-piperidone and 1,3-dimethyl-2-imidazolidinone.

4. The developer solution as claimed in claim 3 wherein the alkali-soluble organic cyclic nitrogen compound as the component (c) is 1,3-dimethyl-2-imidazolidinone.

* * * * *